(12) United States Patent
Song (10) Patent No.: US 6,537,862 B2
(45) Date of Patent: Mar. 25, 2003

(54) METHOD OF FORMING SEMICONDUCTOR DEVICE HAVING A GAA TYPE TRANSISTOR

(75) Inventor: Seung-Heon Song, Sungnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/022,934

(22) Filed: Dec. 18, 2001

(65) Prior Publication Data

US 2002/0177282 A1 Nov. 28, 2002

(30) Foreign Application Priority Data

May 23, 2001 (KR) .................................... 2001-0028369

(51) Int. Cl.[7] .................... H01L 21/00; H01L 21/8238; H01L 27/148
(52) U.S. Cl. .................. 438/157; 438/176; 438/201; 438/211; 438/257; 438/283; 438/593; 257/239; 257/261; 257/314
(58) Field of Search ................ 257/347, 348, 257/349, 352; 438/164, 624, 637, 687, 157, 159

(56) References Cited

U.S. PATENT DOCUMENTS

| | | | |
|---|---|---|---|
| 5,120,666 A | | 6/1992 | Gotou ........................ 437/40 |
| 5,308,999 A | * | 5/1994 | Gotou ........................ 257/213 |
| 5,736,435 A | * | 4/1998 | Venkatesan et al. ........ 438/151 |
| 6,004,837 A | * | 12/1999 | Gambino et al. ........... 438/157 |
| 6,040,243 A | * | 3/2000 | Li et al. ..................... 438/624 |
| 6,043,536 A | * | 3/2000 | Numata et al. ............. 257/219 |

OTHER PUBLICATIONS

Colinge, J.P.; Silicon on Insulator "Gate all around Device" 1990; IEEE; IEDM 90; pp. 595–598.*
Van Zant, Peter; Microchip Fabrication 2000; McGraw–Hill; Fourth Edition; pp. 154–155.*

* cited by examiner

Primary Examiner—Carl Whitehead, Jr.
Assistant Examiner—David L. Hogans
(74) Attorney, Agent, or Firm—Mills & Onello, LLP (57) ABSTRACT

In a method of fabricating a semiconductor device having a gate all around(GAA) structure transistor, an SOI substrate having a SOI layer, a buried oxide layer, and a bottom substrate is prepared. The SOI layer is patterned to form an active layer pattern. An etch stopping layer having an etch selectivity with respect to the buried oxide layer and the active layer pattern is stacked on the active layer pattern. The etch stopping layer pattern is patterned and removed at the gate region crossing the active layer pattern at the channel region, to form an etch stopping layer pattern and to expose the buried oxide layer. The buried oxide layer is isotropically etched using the etch stopping layer pattern as an etch mask to form a cavity at the channel region bottom of the active layer pattern. A conductive material fills the cavity and a space between the etch stopping layer pattern at the gate region. In this manner, the number of photolithography processes required for forming the device is reduced.

10 Claims, 15 Drawing Sheets

METHOD OF FORMING SEMICONDUCTOR DEVICE HAVING A GAA TYPE TRANSISTOR

RELATED APPLICATION

This application relies for priority upon Korean Patent Application No. 2001-28369, filed on May 23, 2001, the contents of which are herein incorporated by reference in their entirety.

FIELD OF THE INVENTION

The present invention relates to a method of fabricating a semiconductor device having a gate all around(GAA) structure transistor.

BACKGROUND OF THE INVENTION

As semiconductor devices become more highly integrated, a number of methods have been developed in order to reduce the sizes of individual devices formed on the semiconductor substrate, and also maximize device performance. Two of the many methods are more common than the others. A first method employs a silicon on insulator (SOI) type substrate, and another method involves forming a three-dimensional device, such as a vertical transistor.

In the first case of using the SOI type substrate, it is possible to perfectly isolate devices, thereby preventing neighboring devices from affecting each other in a highly integrated configuration. Further, the method of using the SOI type substrate provides higher electric pressure resistivity than the method of using device region isolation of a junction, and can reduce the problem of current generation at the junction in an environment of high radiation.

As a representative approach for forming the three-dimensional device, there is the gate all around(GAA) structure. According to the GAA structure, an active region pattern is conventionally formed of a SOI layer on an SOI type substrate. A gate electrode layer is formed to surround a channel portion of the active region pattern covered with a gate insulation layer at a gate electrode. U.S. Pat. No. 5,120,666 and U.S. Pat. No. 5,308,999 disclose a method of fabricating the GAA structure transistor.

In the channel, the entire peripheral portion of the channel surrounded by the gate electrode can be used as a channel, and thus, the effective channel width is increased. Thus, it is possible to solve the problem that the channel width decreases according to the reduction of a device region, thereby decreasing current quantity in a conventional transistor. Also, a channel depletion area formed at the channel peripheral portion can be overlapped and thus, the total channel can form a perfect depletion area.

However, in order to form the GAA structure transistor, a gate electrode should be formed upward and downward the active layer pattern. In forming such a structure, a complex fabrication procedure is required as compared to that of a conventional MOS transistor. Thus, there is a problem that the process becomes complicated and the process expense increases.

SUMMARY OF THE INVENTION

Therefore, it is an object of the present invention to provide a method of fabricating a semiconductor device having a GAA structure transistor, where the transistor device has an effect of widening a channel width.

It is another object of the present invention to provide a method of fabricating a semiconductor device having a GAA structure transistor device, where the method can reduce the number of photo-lithography process to simplify the process in order to reduce process complexity when the GAA structure transistor is formed.

The object can be achieved by a method of fabricating a semiconductor device according to the present invention. The method includes the following steps. That is, a SOI substrate composed of a SOI layer, a buried oxide layer, and a bottom substrate layer is prepared. The SOI layer is patterned to form an active layer pattern. An etch stopping layer having an etch selectivity with respect to the buried oxide layer and the active layer pattern is stacked on the active layer pattern. The etch stopping layer is patterned and removed at the gate region that crosses the active layer pattern at the channel region, to form an etch stopping layer pattern and to expose the buried oxide layer. The buried oxide layer is isotropically etched using the etch stopping layer pattern as an etch mask to form a cavity at the channel region beneath the active layer pattern. A conductive material fills the cavity and the space between the etch stopping layer pattern at the gate region.

In the present invention, the active layer pattern and the conductive material filling the cavity should be electrically isolated. In order to isolate the active layer pattern from the conductive material, after the step of forming the cavity, a gate insulation layer may be formed. Also, in the event that the surface of the active layer pattern is thermal-oxidized or thermal-nitrified to form an insulation layer before stacking the etch stopping layer, the gate insulation layer should be formed at the insulation layer-removed part, that is, at the channel region surface of the active layer pattern, until the step of forming the cavity in order to compensate the insulation layer-removed part. Thus, thickness and composition of the insulation layer formed on the surface of the active layer pattern can be different from those of the insulation layer formed on the surfaces of the source/drain regions and the channel region, respectively.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 1A through 9C illustrate process steps according to the present invention. In each figure, the 'A' refers to a process plan, the 'B' refers to cross-sectional view cutting a plan of a figure 'A' in the direction of I—I. The 'C' refers to a cross-sectional view cutting a plan of a figure 'A' in the direction of II—II.

DETAILED DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1A:
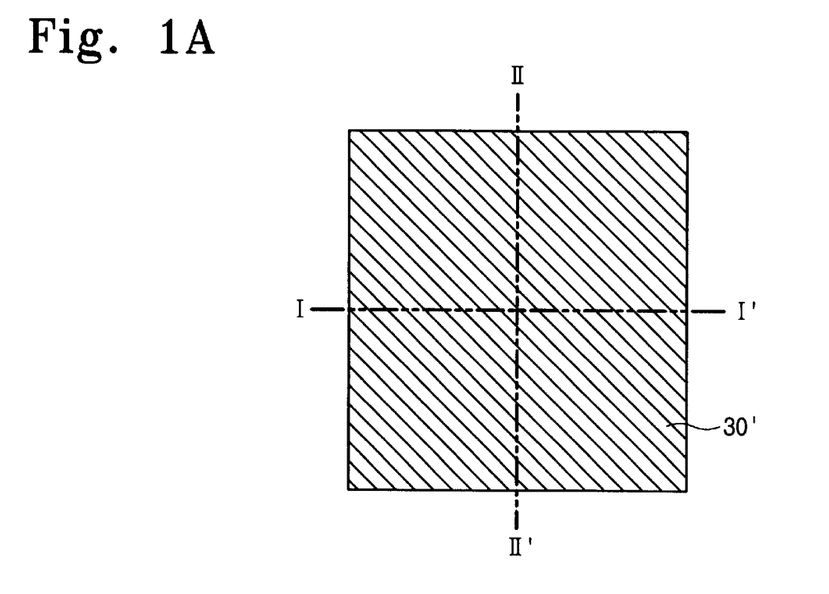
Figure 1B:
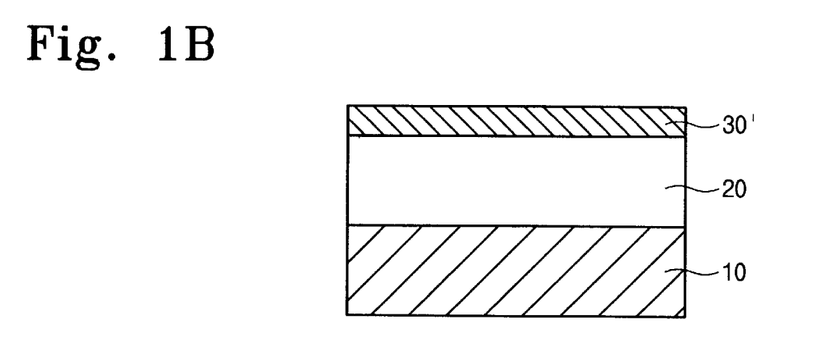
Figure 1C:
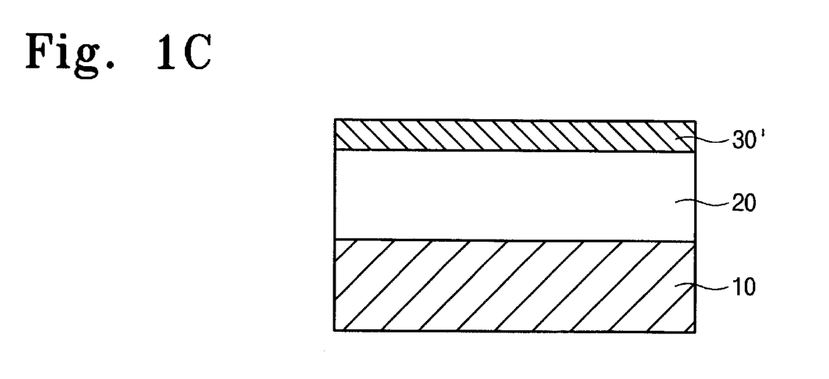

Referring to FIGS. 1A, 1B and 1C, a SOI substrate is composed of a SOI layer 30', a buried oxide layer 20, and a bottom semiconductor substrate 10. The SOI layer is, for example, formed of a silicon-based single crystal layer. FIG. 1A is a plan for illustrating the SOI substrate. FIGS. 1B and 1C are cross-sectional views cutting the SOI substrate of FIG. 1A in the I—I and II—II directions, respectively.

Several methods for fabricating the SOI substrate are possible. For example, one method includes the following steps. That is, a thermal oxide layer having a certain thickness is formed on the surface of a first bulk type substrate. A second bulk type substrate is prepared and the two substrates are welded together. The belly side of the first bulk type substrate is substantially removed by a chemical-mechanical polishing (CMP) technique. Further, it is possible to use a method such as oxygen ion-implantation for formation of the buried oxide layer.

However, referring to the case of a thin film transistor, the thin film transistor has both low conductivity in comparison with the SOI layer and low function as a channel, but the active layer pattern can be formed of a polysiticon layer instead of the SOI layer.

Figure 2A:
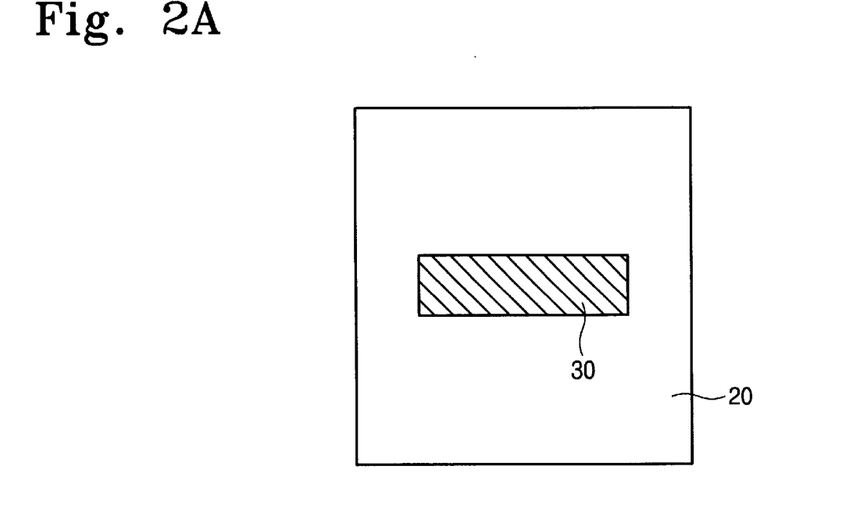
Figure 2B:
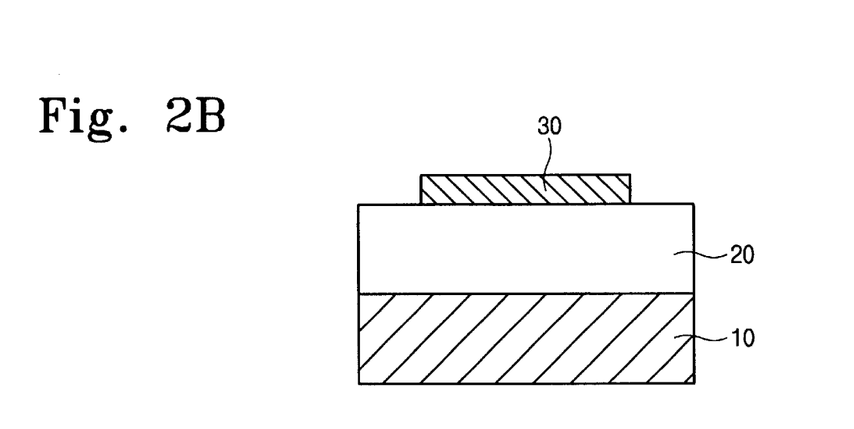
Figure 2C:
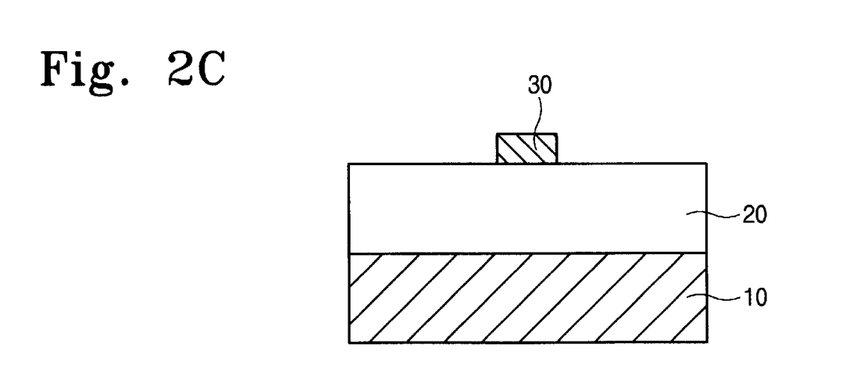

Referring to FIGS. 2A, 2B, and 2C, the SOI layer 30' is patterned to form an active layer pattern 30. The width and length of the active layer pattern 30 can be adjusted as occasion demands. In the event that the width of the active layer pattern is formed relatively large, an under-cut is widened toward the source/drain regions during a subsequent step of isotropically etching the buried oxide layer. Thus, it is preferable that thickness of the active layer pattern is relatively small. The height of the active layer pattern is determined when the SOI substrate is formed. Preferably, the thickness of the buried oxide layer is above one micrometer, and the thickness of the silicon single crystal layer is about 1,000 Å to 1,500 Å.

Figure 3A:
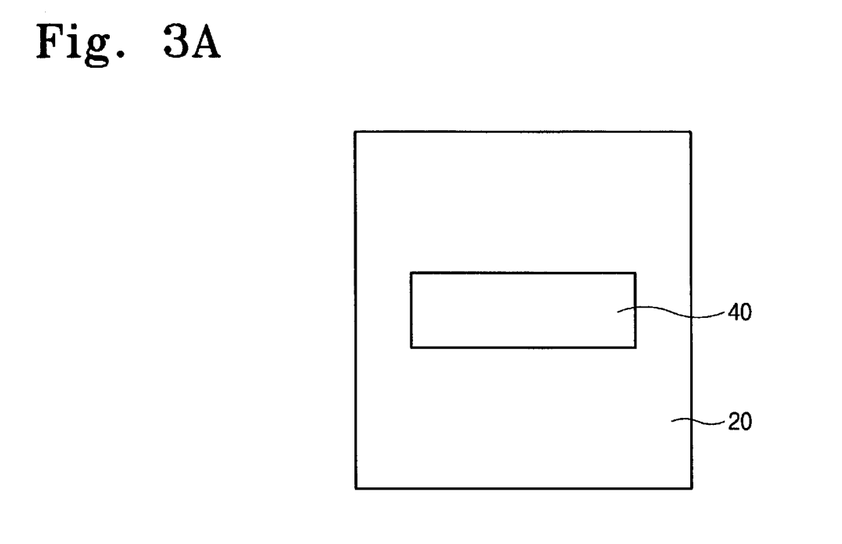
Figure 3B:
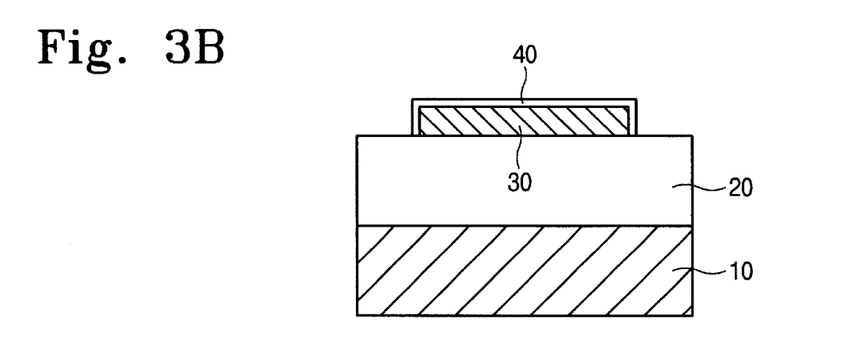
Figure 3C:
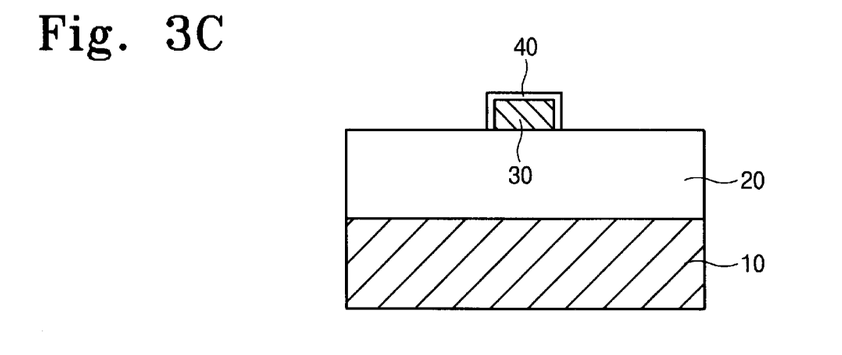

Referring to FIGS. 3A, 3B and 3C, the surface of the active layer pattern is thermal-oxidized to form an insulation layer 40 to a thickness of about 100 Å. The surface of the active layer pattern 30 can be nitrified to form the 0o insulation layer 40 under nitrogen ambient and a high dielectric layer can be deposited on the surface of the active layer by chemical vapor deposition (CVD). A channel ion-implantation process can be performed before or after thermal oxidation.

Figure 4A:
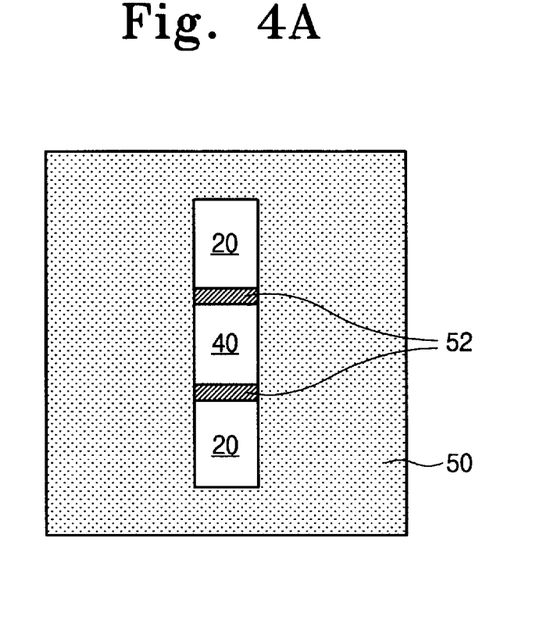
Figure 4B:
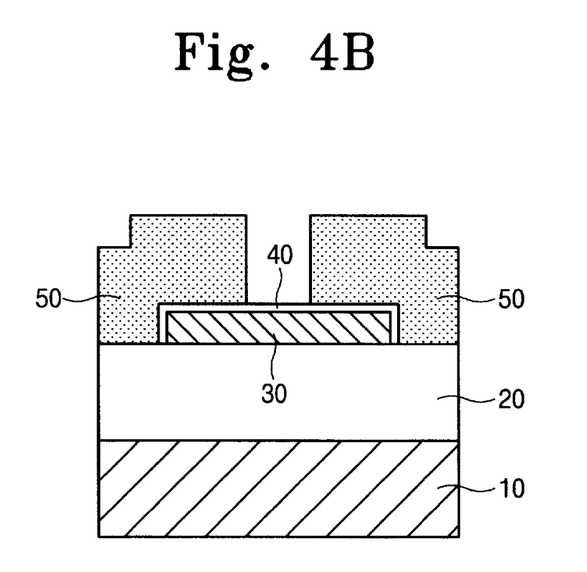
Figure 4C:
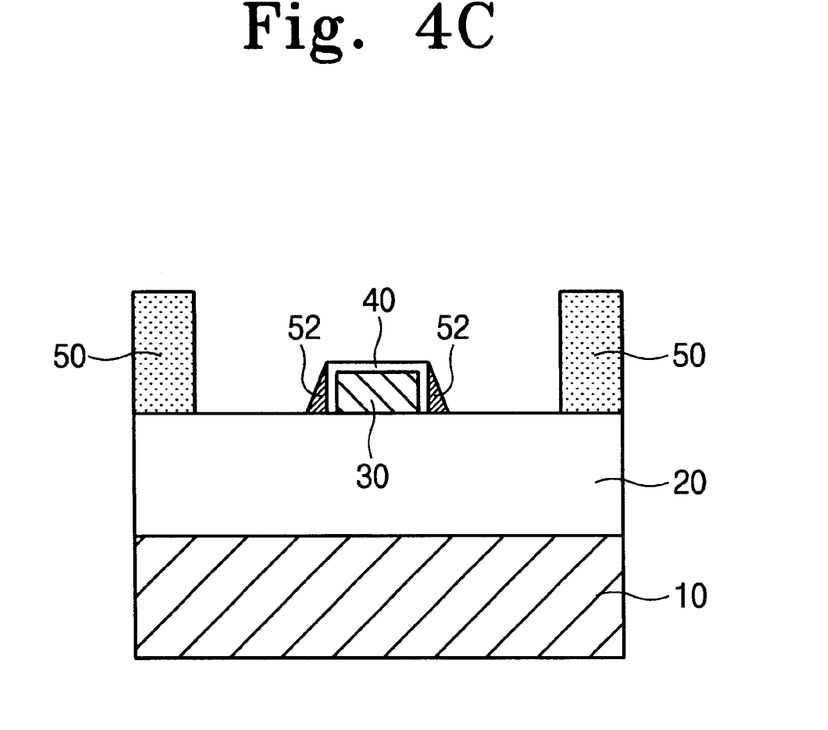

Referring to FIGS. 4A, 4B and 4C, an etch stopping layer formed of silicon nitride is stacked on the active layer pattern 30 covered with the insulation layer 40. Preferably, the etch stopping layer comprises a material having an etch selectivity with respect to the insulation layer 40 and the buried oxide layer 20. After stacking the etch stopping layer, the etch stopping layer is removed in the gate region through a patterning process, for example using photo-lithography, to form the etch stopping layer pattern 50. At this time, while anisotropic etching is performed, both the insulation layer 40 and the buried oxide layer 20 serve as an etch stopping layer, where the insulation layer 40 comprises a thermal oxide layer covering the active layer pattern 30. In the event that over-etching is not sufficiently performed in order to reduce the etch damage of the active layer pattern 30 and to speed up process time, a sidewall spacer 52 remains at the sidewalls of the active layer pattern 30 covered by the insulation layer 40. The gate region is formed to the direction of crossing the active layer pattern, and overlapped with the channel region when the gate region is seen upward, where the channel region is a middle part of the active layer pattern 30. Thus, the etch stopping layer pattern 50 is removed in the gate region to expose the channel region of the active layer pattern 30 covered by the insulation layer 40.

Figure 5A:
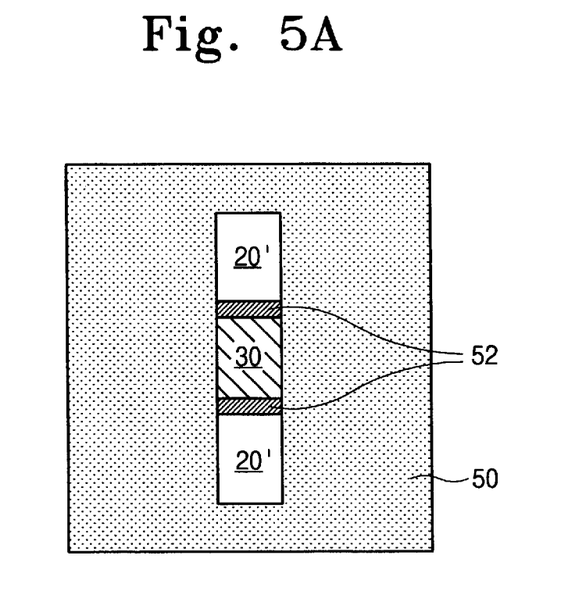
Figure 5B:
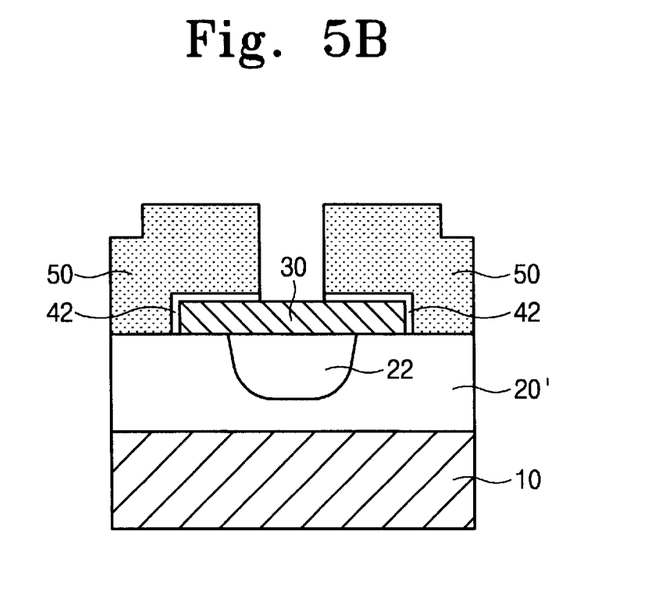
Figure 5C:
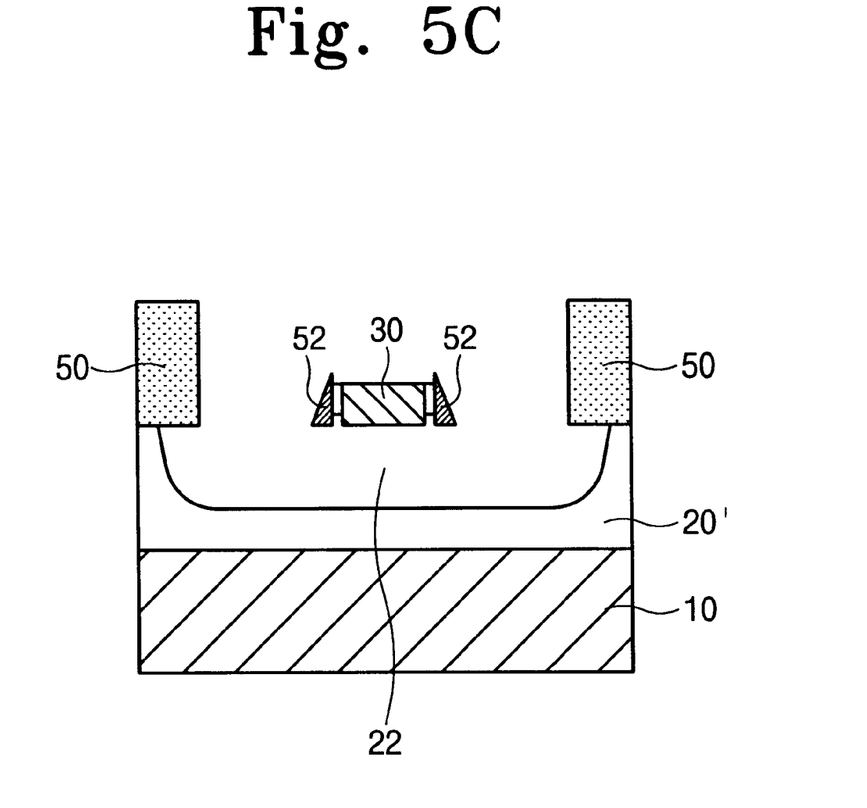

Referring to FIGS. 5A, 5B, and 5C, a buried oxide layer 20' is isotropically etched using the channel region of the active layer pattern 30 exposed between the right etch stopping layer pattern 50 and the left etch stopping layer pattern 50. At this time, the thermal oxide layer covering the channel region of the active layer pattern is together removed and thus, only the portion of the insulation layer 42 protected by the etch stopping layer pattern 50 remains. For isotropic etching, a wet-etching using a dilute fluoric acid solution and an isotropic dry-etching are employed. As the etching is performed, when the under-cut part formed to the channel region bottom is connected at the both sides of the active layer pattern 30, a cavity 22 is formed in the channel region bottom. The thermal oxide layer between the sidewall spacer 52 and the active layer pattern 30 is not well etched and remains because of a loading effect at the narrow gap between them.

At this time, preferably, anisotropic dry-etching is performed before entirely performing isotropic etching. Next, wet-etching can be laterally performed toward the active layer pattern 30. The width of the active layer pattern 30 is formed narrowly in a conventional highly integrated semiconductor device. Thus, it is not very difficult to form a cavity 22 in it process of lateral etching.

Figure 6A:
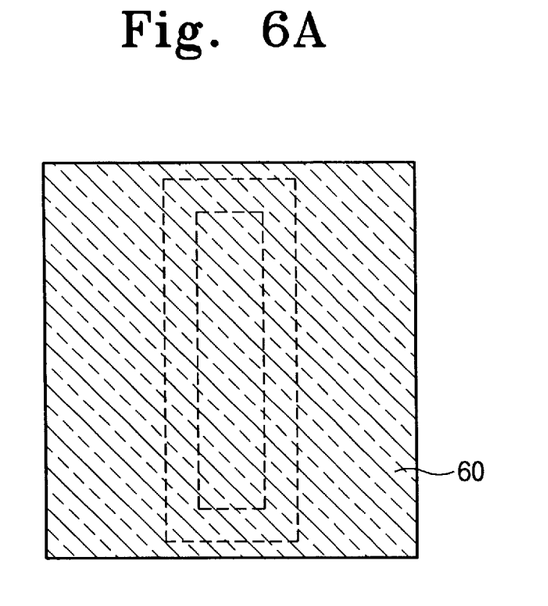
Figure 6B:
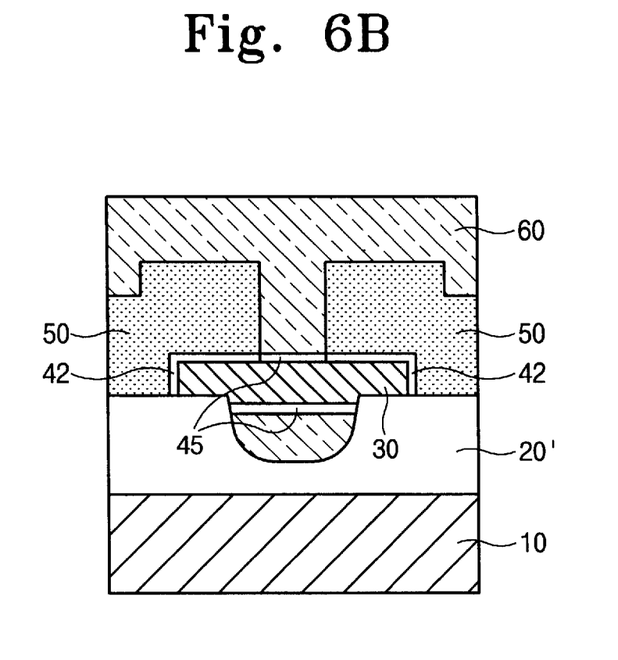
Figure 6C:
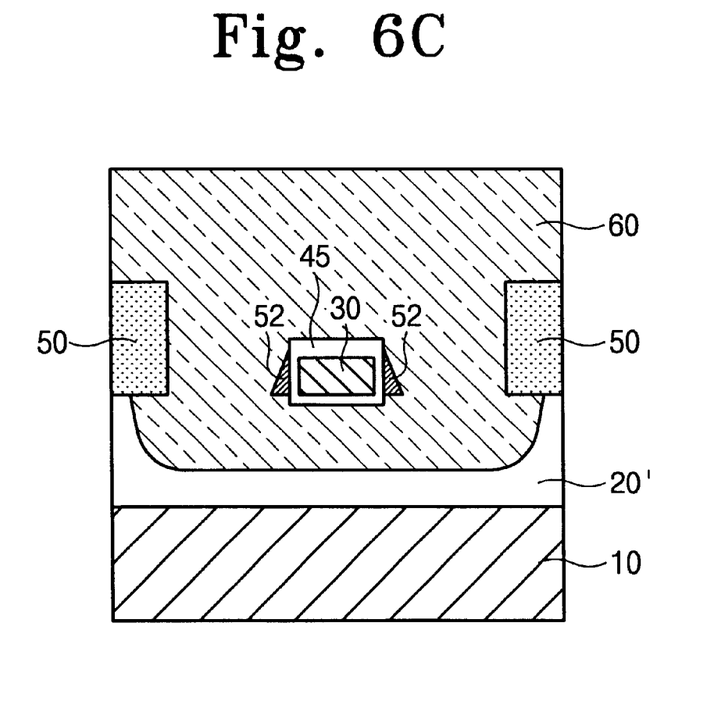

Referring to FIGS. 6A, 6B and 6C, after the thermal oxide layer is removed at the channel region of the active layer pattern, a channel part insulation layer 45 functioning as a gate insulation layer is formed at the channel part surface of the active layer pattern 30. Conventionally, the gate insulation layer is formed of a thermal oxide layer or a nitride layer through thermal oxidation or thermal nitrification, but the gate insulation layer can be formed of an aluminum oxide layer, a tantalum oxide layer, a titanium oxide layer, a zirconium oxide layer, a hafnium oxide layer or other high dielectrics such as BST or PZT by employing the CVD technique having a good step coverage or an atomic layer deposition(ALD) technique. Before forming the channel part insulation layer 45, hydrogen heat-treatment can be performed in order to alleviate that the active layer pattern 30 of the channel region is angled. The thickness of the channel part insulation layer 45 varies with the function of a transistor device, but should be 20 Å to 50 Å in a drive circuit device.

A conductive material layer 60 composing the gate electrode is stacked on the semiconductor substrate by the CVD technique. Thus, the gate region where the etch stopping layer is removed, including the cavity 22 between the active layer pattern 30 of the channel region and the buried oxide layer 20', is filled with a conductive material layer 60. Preferably, the conductive material layer 60 is formed of a material having a superior gap-fill capability so as not to have any remaining gaps under the CVD technique. As the conductive material, silicon, silicon germanium, tungsten, tungsten nitride, a dual layer of a titanium nitride layer and tungsten, aluminum, molybdenum, and tantalum can be used.

Figure 7A:
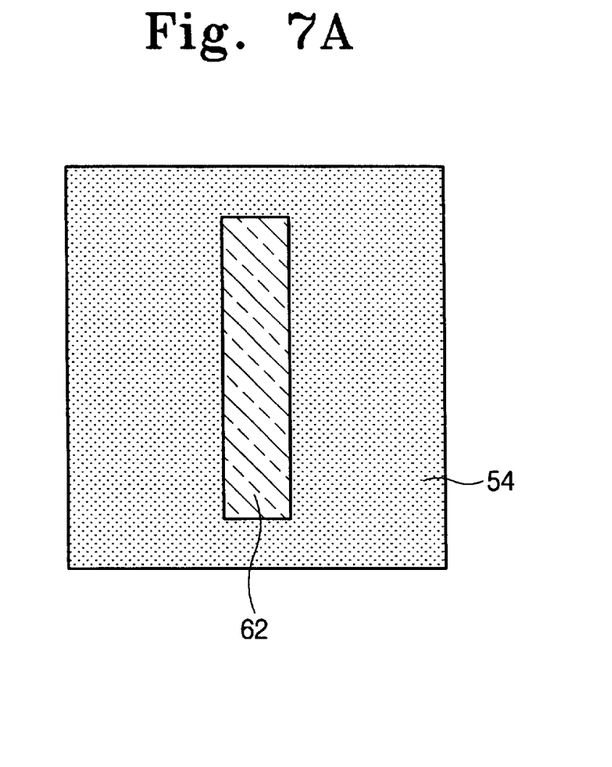
Figure 7B:
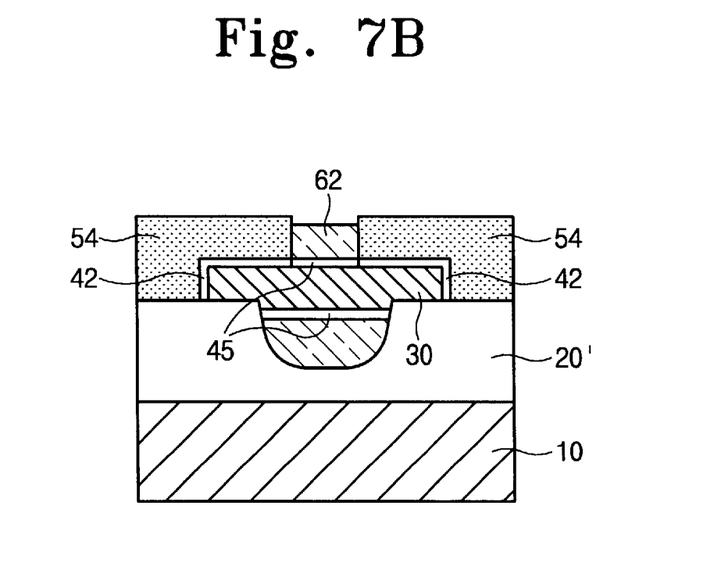
Figure 7C:
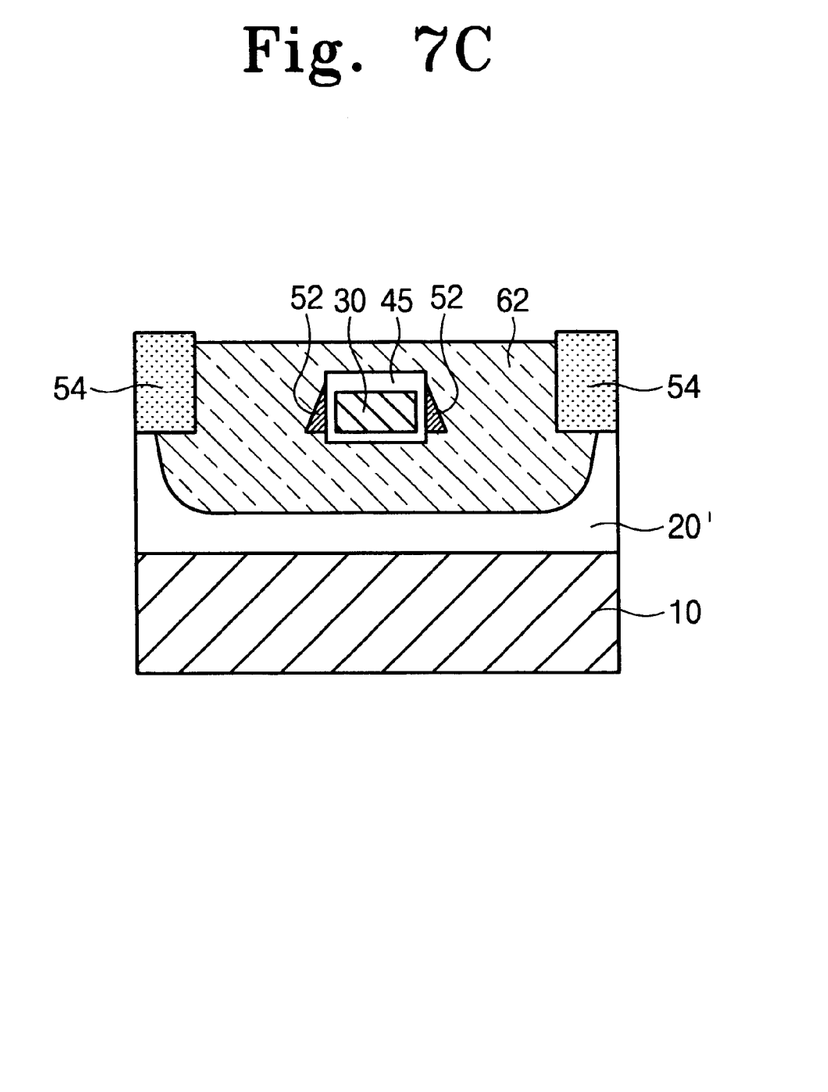

Referring to FIGS. 7A, 7B and 7C, the conductive material layer 60 stacked on the etch stopping layer pattern 50 defining the gate region, is removed by an entire surface anisotropic etch or the CMP technique. Thus, the top surface of an etch stopping layer pattern 54 is exposed to form the gate electrode 62.

Figure 8A:
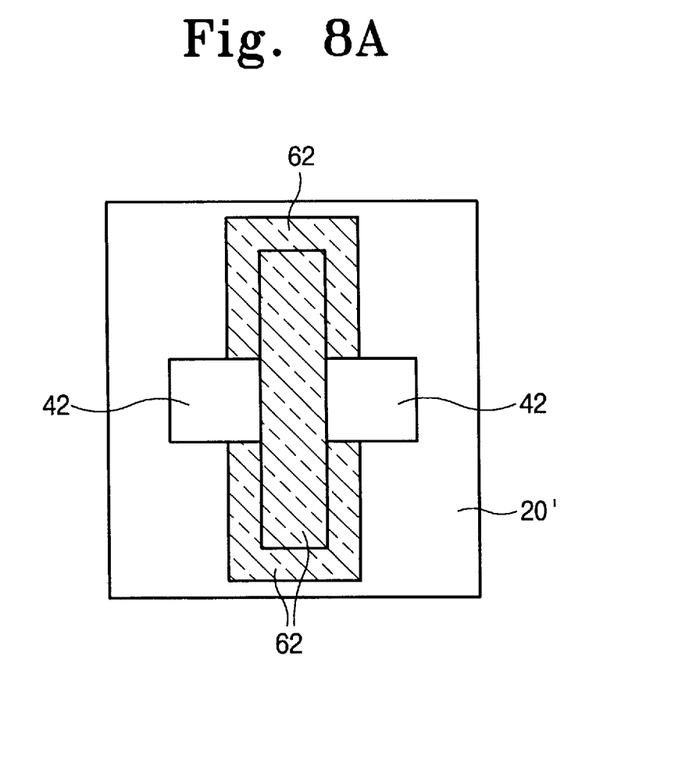
Figure 8B:
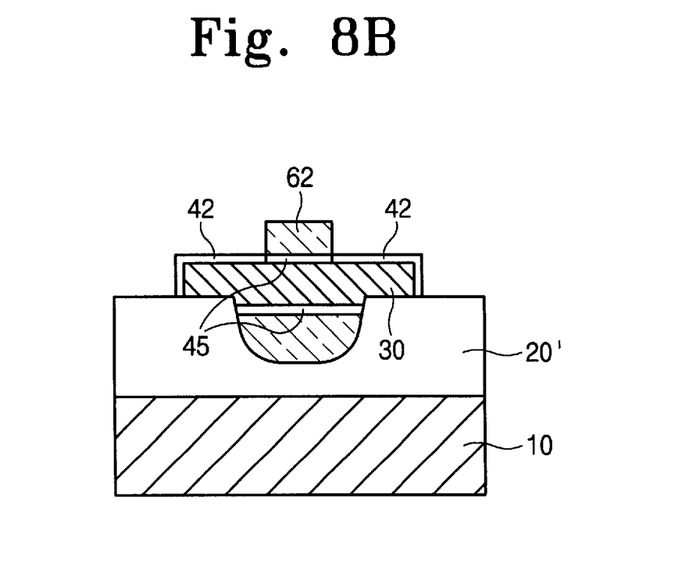
Figure 8C:
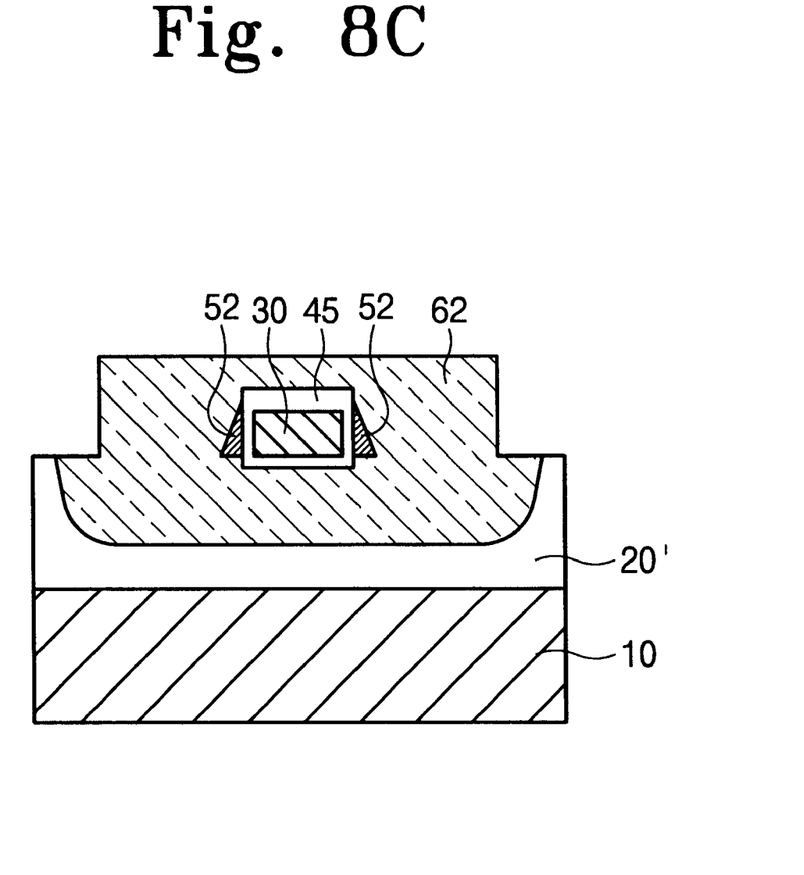

Referring to FIGS. 8A, 8B and 8C, the etch stopping layer pattern 54 is entirely removed by phosphoric wet-etching. Thus, it is possible to form a gate all around(GAA) structure transistor wherein the channel region of the active layer pattern 30 is surrounded by the gate electrode 62, in the state that the channel portion of the insulation layer 45 is interposed between the active layer pattern 30 and the gate electrode 62. A low concentration ion-implantation is performed in order to form an LDD type source/drain region of the active layer pattern 30.

Figure 9A:
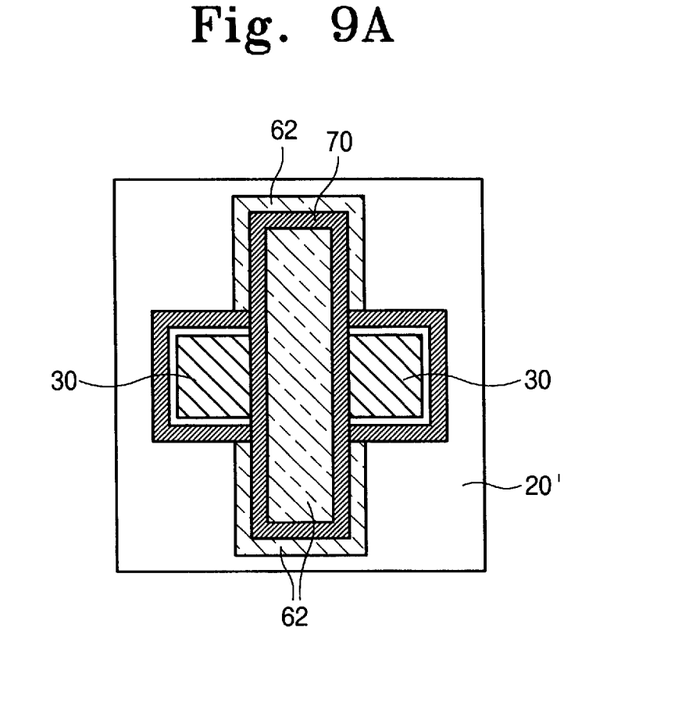
Figure 9B:
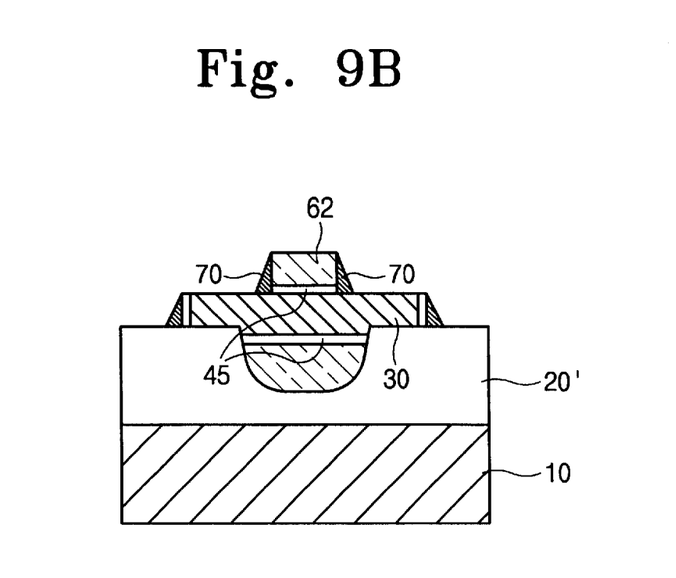
Figure 9C:
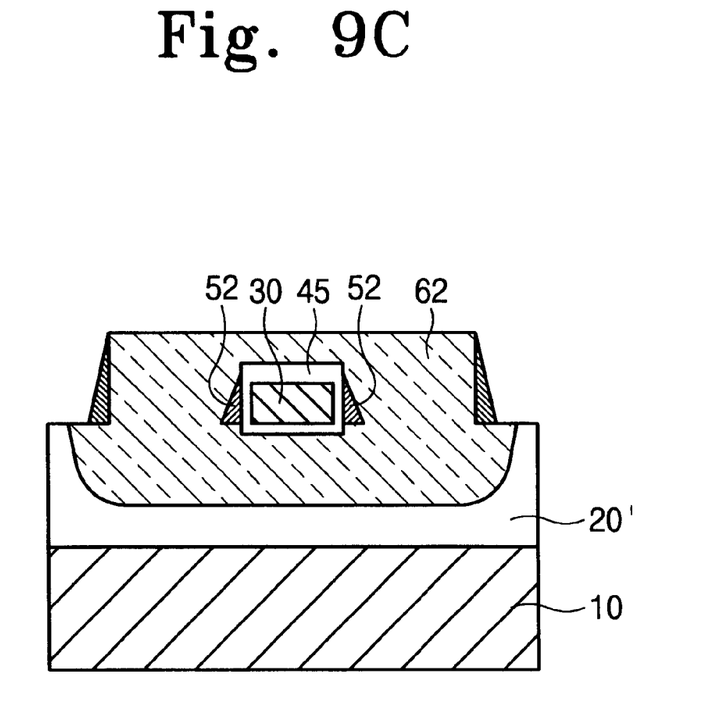

Referring to FIGS. 9A, 9B and 9C, an insulation spacer 70 is formed at the sidewalls of the gate electrode 62, and a high concentration ion-implantation is performed. Low and high concentration ion-implantations can be formed in the state that the thermal oxide layer of the source/drain regions is removed as occasion demands.

Subsequently, an insulation layer is stacked and patterned to form a contact hole at the interlayer insulation layer. Thus, a contact can be connected at the source/drain regions. The gate electrode can be formed with the feature of a gate line, or external voltage can be applied at the gate electrode through an additional contact as in the source/drain regions.

According to the present invention, a GAA structure transistor can be formed by employing a photo-lithography process only twice, and thus, the process can be simplified in comparison with the conventional approaches of fabricating a GAA structure transistor.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a semiconductor device having a gate all around (GAA) structure transistor comprising the steps of:

preparing a SOI substrate comprising a SOI layer and a buried oxide layer on an underlying substrate layer;

patterning the SOI layer to form an active layer pattern;

stacking an etch stopping layer having an etch selectivity with respect to the buried oxide layer and the active layer pattern, over the active layer pattern;

patterning the etch stopping layer to expose a channel region of the active layer pattern and the buried oxide layer;

isotropically etching the buried oxide layer using the patterned etch stopping layer as an etch mask to form a cavity at a bottom of the channel region of the active layer pattern; and filling both the cavity and the space between the patterned etch stopping layer with a conductive material.

2. The method of claim 1 further comprising after the step of forming the cavity, forming a gate insulation layer.

3. The method of claim 1, further comprising the steps of:

forming a thermal oxide layer at a surface of the active layer pattern before the step of stacking the etch stopping layer; and forming a gate insulation layer at a surface of the channel region surface of the active layer pattern after the step of forming the cavity.

4. The method of claim 3, wherein the gate insulation layer is formed of a material selected from the group consisting of: an aluminum oxide layer, a tantalum oxide layer, a titanium oxide layer, a zirconium oxide layer, a hafnium oxide layer, BST, and PZT.

5. The method of claim 2, wherein the gate insulation layer is formed of a material selected from the group consisting of: an aluminum oxide layer, a tantalum oxide layer, a titanium oxide layer, a zirconium oxide layer, a haffiium oxide layer, BST, and PZT.

6. The method of claim 1, further comprising, before the step of stacking the etch stopping layer, forming an insulation layer at a surface of the active layer pattern in a CVD process, wherein the insulation layer is formed of a material selected from the group consisting of: an aluminum oxide layer, a tantalum oxide layer, a titanium oxide layer, a zirconium oxide layer, a haffium oxide layer, BST, and PZT.

7. The method of claim 1, wherein the etch stopping layer is formed of silicon nitride.

8. The method of claim 1, wherein the conductive material is formed of a material selected from the group consisting of silicon, silicon germanium, tungsten, tungsten nitride, a dual layer of titanium nitride and tungsten, aluminum, molybdenum, and tantalum.

9. The method of claim 1, further comprising the steps of:

planarization-etching the conductive material stacked on the top surface of the etch stopping layer to form a gate electrode; and etching and removing the etch stopping layer pattern.

10. The method of claim 9, further comprising the steps of:

performing a low concentration ion-implantation at source/drain regions of the active layer pattern exposed by removing the etch stopping layer pattern;

forming insulation spacers at sidewalls of the gate electrode; and performing a high concentration ion-implantation at the source/drain regions where the gate electrode periphery is covered by the insulation spacer.

* * * * *

UNITED STATES PATENT AND TRADEMARK OFFICE
CERTIFICATE OF CORRECTION

PATENT NO. : 6,537,862 B2
DATED : March 25, 2003
INVENTOR(S) : Seung-Heon Song It is certified that error appears in the above-identified patent and that said Letters Patent is hereby corrected as shown below:

<u>Column 6,</u>
Lines 19 and 26, delete "haffium" and insert -- hafnium --.

Signed and Sealed this

Nineteenth Day of August, 2003

JAMES E. ROGAN
*Director of the United States Patent and Trademark Office*